United States Patent
Albert et al.

[11] Patent Number: 6,118,426
[45] Date of Patent: Sep. 12, 2000

[54] TRANSDUCERS AND INDICATORS HAVING PRINTED DISPLAYS

[75] Inventors: Jonathan D. Albert; Barrett Comiskey, both of Cambridge; Joseph M. Jacobson, Newton Centre, all of Mass.

[73] Assignee: E Ink Corporation, Cambridge, Mass.

[21] Appl. No.: 09/140,856

[22] Filed: Aug. 27, 1998

Related U.S. Application Data

[63] Continuation-in-part of application No. 08/504,896, Jul. 20, 1995, which is a continuation-in-part of application No. 08/983,404, Jul. 19, 1997, and a continuation-in-part of application No. 08/935,800, Sep. 23, 1997

[60] Provisional application No. 60/057,133, Aug. 28, 1997, provisional application No. 60/057,716, Aug. 28, 1997, provisional application No. 60/057,122, Aug. 28, 1997, provisional application No. 60/057,798, Aug. 28, 1997, provisional application No. 60/057,799, Aug. 28, 1997, provisional application No. 60/057,163, Aug. 28, 1997, provisional application No. 60/057,118, Aug. 28, 1997, provisional application No. 60/059,358, Sep. 19, 1997, provisional application No. 60/059,543, Sep. 19, 1997, provisional application No. 60/065,629, Nov. 18, 1997, provisional application No. 60/065,630, Nov. 18, 1997, provisional application No. 60/065,605, Nov. 18, 1997, provisional application No. 60/066,147, Nov. 19, 1997, provisional application No. 60/066,245, Nov. 20, 1997, provisional application No. 60/066,246, Nov. 20, 1997, provisional application No. 60/066,115, Nov. 21, 1997, provisional application No. 60/066,334, Nov. 21, 1997, provisional application No. 60/066,418, Nov. 24, 1997, provisional application No. 60/070,940, Jan. 9, 1998, provisional application No. 60/071,371, Jan. 15, 1998, provisional application No. 60/072,390, Jan. 9, 1998, provisional application No. 60/070,939, Jan. 9, 1998, provisional application No. 60/070,935, Jan. 9, 1998, provisional application No. 60/074,454, Feb. 12, 1998, provisional application No. 60/076,955, Mar. 5, 1998, provisional application No. 60/076,959, Mar. 5, 1998, provisional application No. 60/076,957, Mar. 5, 1998, provisional application No. 60/076,978, Mar. 5, 1998, provisional application No. 60/078,363, Mar. 18, 1998, provisional application No. 60/083,252, Apr. 27, 1998, provisional application No. 60/085,096, May 12, 1998, provisional application No. 60/090,223, Jun. 22, 1998, provisional application No. 60/090,232, Jun. 22, 1998, provisional application No. 60/092,046, Jul. 8, 1998, provisional application No. 60/092,050, Jul. 8, 1998, and provisional application No. 60/093,689, Jul. 22, 1998.

[51] Int. Cl.[7] .................................................. G09G 3/34
[52] U.S. Cl. .......................... 345/107; 345/108; 359/296; 429/93; 340/825.31; 340/825.56; 324/96; 315/150; 40/455
[58] Field of Search .................................. 345/107, 108; 429/93; 359/296; 340/825.31, 825.56; 324/96; 315/150; 40/455, 124.03; 430/37

[56] References Cited

U.S. PATENT DOCUMENTS

| 3,668,106 | 6/1972 | Ota .......................................... 204/299 |
| 3,756,693 | 9/1973 | Ota ........................................ 350/160 R |
| 3,792,308 | 2/1974 | Ota .......................................... 315/150 |
| 4,272,596 | 6/1981 | Harbour et al. ........................... 430/37 |
| 4,301,407 | 11/1981 | Koslar ....................................... 324/96 |
| 4,655,897 | 4/1987 | DiSanto et al. ...................... 204/299 R |
| 4,703,573 | 11/1987 | Montgomery et al. .................... 40/455 |
| 4,742,345 | 5/1988 | DiSanto et al. ............................ 340/87 |
| 4,746,917 | 5/1988 | DiSanto et al. .......................... 340/787 |
| 5,187,609 | 2/1993 | DiSanto et al. .......................... 359/296 |
| 5,256,500 | 10/1993 | Ishimoto .................................... 429/93 |
| 5,450,069 | 9/1995 | DiSanto et al. ..................... 340/825.31 |
| 5,484,292 | 1/1996 | McTaggart ............................... 434/317 |
| 5,500,635 | 3/1996 | Mott ................................... 340/323 R |
| 5,508,720 | 4/1996 | DiSanto et al. .......................... 345/169 |
| 5,600,172 | 2/1997 | McDevitt et al. ....................... 257/436 |

FOREIGN PATENT DOCUMENTS

| 0 618 715 A1 | 10/1994 | European Pat. Off. . |
| 0 684 579 A2 | 11/1995 | European Pat. Off. . |
| 62-269124 | 11/1987 | Japan . |
| 01-086116 | 3/1989 | Japan . |
| 64-86116 | 3/1989 | Japan . |
| 01-267525 | 10/1989 | Japan . |
| 2551783 | 8/1996 | Japan . |
| 10-149118 | 6/1998 | Japan . |
| WO 82/02961 | 9/1982 | WIPO . |
| WO 92/17873 | 10/1992 | WIPO . |
| WO 94/24236 | 10/1994 | WIPO . |

OTHER PUBLICATIONS

Negroponte and Jacobson, "Surface and Displays," *Wired*, Jan. 1997, p. 212.

Ota et al., "Developments in Electrophoretic Displays," *Proceeding of the S.I.D.*, vol. 183 & 4, Third and Fourth Quarters, Aug. 1977, pp. 243–254.

Andrew T. Dalisa, "Electrophoretic Display Technology," *Transactions on Electron Devices*, vol. ED–24, No. 7, Jul. 1977, pp. 827–834.

Croucher et al., "Electrophoretic Display: Materials as Related to Performance," *Society of Photographic Scientists and Engineering*, vol. 25, No. 2, Mar./Apr. 1981, pp. 80–85.

Shiwa et al., "Electrophoretic Display Method Using Ionographic Technology," *SID 88 Digest*, Jan. 1988, pp. 61–62.

*Primary Examiner*—John E. Breene
*Assistant Examiner*—Cheryl Lewis
*Attorney, Agent, or Firm*—Testa, Hurwitz & Thibeault, LLP

[57] ABSTRACT

A process for creating an electronically addressable display includes multiple printing operations, similar to a multi-color process in conventional screen printing. In some of the process steps, electrically non-active inks are printed onto areas of the receiving substrate, and in other steps, electrically active inks are printed onto different areas of the substrate. The printed display can be used in a variety of applications. This display can be used as an indicator by changing state of the display after a certain time has elapsed, or when a certain pressure, thermal, radiative, moisture, acoustic, inclination, pH, or other threshold is passed. In one embodiment, the display is incorporated into a battery indicator. A sticker display is described. The sticker is adhesive backed and may then be applied to a surface to create a functional information display unit. This invention also features a display that is both powered and controlled using radio frequencies. It describes a complete system for controlling, addressing, and powering a display. The system includes an antenna or antennae, passive charging circuitry, and active control system, a display, and an energy storage unit. There is also a separate transmitter that provides the remote power for the display. The system is meant to be used anywhere it is useful to provide intermittent updates of information such as in a store, on a highway, or in an airport. A tile-based display allowing a modular system for large area display is created using a printable display material.

20 Claims, 8 Drawing Sheets

TRANSDUCERS AND INDICATORS HAVING PRINTED DISPLAYS

CROSS-REFERENCE TO RELATED APPLICATIONS

This application is a continuation-in-part of U.S. Ser. No. 08/504,896 filed Jul. 20, 1995, pending, U.S. Ser. No. 08/983,404 filed Jul. 19, 1997, abandoned, and U.S. Ser. No. 08/935,800 filed Sep. 23, 1997, allowed, the contents of all of which are incorporated herein by reference. This application claims priority to U.S. Ser. No. 60/057,133 filed Aug. 28, 1997, U.S. Ser. No. 60/057,716, filed Aug. 28, 1997, U.S. Ser. No. 60/057,122, filed Aug. 28, 1997, U.S. Ser. No. 60/057,798, filed Aug. 28, 1997, U.S. Ser. No. 60/057,799 filed Aug. 28, 1997, U.S. Ser. No. 60/057,163 filed Aug. 28, 1997, U.S. Ser. No. 60/057,118, filed Aug. 28, 1997, U.S. Ser. No. 60/059,358, filed Sep. 19, 1997, U.S. Ser. No. 60/059,543 filed Sep. 19, 1997, U.S. Ser. No. 60/065,629, filed Nov. 18, 1997, U.S. Ser. No. 60/065,630 filed Nov. 18, 1997, U.S. Ser. No. 60/065,605 filed Nov. 18, 1997, U.S. Ser. No. 60/066,147, filed Nov. 19, 1997, U.S. Ser. No. 60/066,245, filed Nov. 20, 1997, U.S. Ser. No. 60/066,246, filed Nov. 20, 1997, U.S. Ser. No. 60/066,115 filed Nov. 21, 1997, U.S. Ser. No. 60/066,334 filed Nov. 21, 1997, U.S. Ser. No. 60/066,418 filed Nov. 24, 1997, U.S. Ser. No. 60/070,940 filed Jan. 9, 1998, U.S. Ser. No. 60/071,371 filed Jan. 15, 1998, U.S. Ser. No. 60/072,390 filed Jan. 9, 1998, U.S. Ser. No. 60/070,939 filed Jan. 9, 1998, U.S. Ser. No. 60/070,935 filed Jan. 9, 1998, U.S. Ser. No. 60/074,454, filed Feb. 12, 1998, U.S. Ser. No. 60/076,955 filed Mar. 5, 1998, U.S. Ser. No. 60/076,959 filed Mar. 5, 1998, U.S. Ser. No. 60/076,957 filed Mar. 5, 1998, U.S. Ser. No. 60/076,978 filed Mar. 5, 1998, U.S. Ser. No. 60/078,363 filed Mar. 18, 1998, U.S. Ser. No. 60/083,252 filed Apr. 27, 1998, U.S. Ser. No. 60/085,096 filed May 12, 1998, U.S. Ser. No. 60/090,223 filed Jun. 22, 1998, U.S. Ser. No. 60/090,232 filed Jun. 22, 1998, U.S. Ser. No. 60/092,046 filed Jul. 8, 1998, U.S. Ser. No. 60/092,050 filed Jul. 8, 1998, and U.S. Ser. No. 60/093,689 filed Jul. 22, 1998, the contents of all of which are incorporated herein by reference.

FIELD OF THE INVENTION

The present invention relates to display applications, and in particular, to transducers and indicators having printed displays, including printed encapsulated electrophoretic displays.

BACKGROUND OF THE INVENTION

Many applications can benefit from inclusion of a display. For example, projection devices, sketching apparatuses, telephones, pocketbooks, and battery indicators are only a few applications that display transient information. To date, widespread incorporation of displays has been hindered because such applications generally require flexible displays that consume very little power.

Despite much effort directed to developing highly-flexible, reflective display media, there are relatively few examples of displays formed on semi-flexible substrates, and these examples have found only moderate success. For example, plastic-based liquid crystal displays, including twisted nematic (TN), supertwisted nematic (STN), polymer dispersed liquid crystal (PDLC), and bistable cholesteric liquid crystals have been developed. Nevertheless, problems remain with liquid crystal alignment in TN and STN displays, cholesteric displays are sensitive to changes in their cell gap, and local stress can cause changes in the scattering or absorbance of PDLC and cholesteric films. As such, only moderate flexibility can be achieved with these displays.

Emissive electroluminescent films and organic light emitting diode films can be deposited on flexible substrates to create flexible displays. However, these devices require continuous power consumption for operation, and thus are not practical for many applications.

Another problem with developing highly flexible displays is the lack of an appropriate conductor for addressing the display elements. Typically, an indium tin oxide (ITO) layer vacuum sputtered onto a plastic substrate is used as a top conductor for displays. An ITO layer, however, can be damaged when the display is flexed. If the local curvature of the plastic substrate becomes too great, the ITO layer tends to crack, damaging the display.

SUMMARY OF THE INVENTION

An object of the invention is to provide a highly-flexible, reflective display which can be manufactured easily, consumes little (or no in the case of bistable displays) power, and can, therefore, be incorporated into a variety of applications. The invention features a printable display comprising an encapsulated electrophoretic display medium. The resulting display is flexible. Since the display media can be printed, the display itself can be made inexpensively.

An encapsulated electrophoretic display can be constructed so that the optical state of the display is stable for some length of time. When the display has two states which are stable in this manner, the display is said to be bistable. If more than two states of the display are stable, then the display can be said to be multistable. For the purpose of this invention, the term bistable will be used to indicate a display in which any optical state remains fixed once the addressing voltage is removed. The definition of a bistable state depends on the application for the display. A slowly-decaying optical state can be effectively bistable if the optical state is substantially unchanged over the required viewing time. For example, in a display which is updated every few minutes, a display image which is stable for hours or days is effectively bistable for that application. In this invention, the term bistable also indicates a display with an optical state sufficiently long-lived as to be effectively bistable for the application in mind. Alternatively, it is possible to construct encapsulated electrophoretic displays in which the image decays quickly once the addressing voltage to the display is removed (i.e., the display is not bistable or multistable). As will be described, in some applications it is advantageous to use an encapsulated electrophoretic display which is not bistable. Whether or not an encapsulated electrophoretic display is bistable, and its degree of bistability, can be controlled through appropriate chemical modification of the electrophoretic particles, the suspending fluid, the capsule, and binder materials.

An encapsulated electrophoretic display may take many forms. The display may comprise capsules dispersed in a binder. The capsules may be of any size or shape. The capsules may, for example, be spherical and may have diameters in the millimeter range or the micron range, but is preferably from ten to a few hundred microns. The capsules may be formed by an encapsulation technique, as described below. Particles may be encapsulated in the capsules. The particles may be two or more different types of particles. The particles may be colored, luminescent, light-absorbing or transparent, for example. The particles may include neat pigments, dyed (laked) pigments or pigment/polymer composites, for example. The display may further comprise a suspending fluid in which the particles are dispersed.

The successful construction of an encapsulated electrophoretic display requires the proper interaction of several different types of materials and processes, such as a polymeric binder and, optionally, a capsule membrane. These materials must be chemically compatible with the electrophoretic particles and fluid, as well as with each other. The capsule materials may engage in useful surface interactions with the electrophoretic particles, or may act as a chemical or physical boundary between the fluid and the binder.

In some cases, the encapsulation step of the process is not necessary, and the electrophoretic fluid may be directly dispersed or emulsified into the binder (or a precursor to the binder materials) and an effective "polymer-dispersed electrophoretic display" constructed. In such displays, voids created in the binder may be referred to as capsules or microcapsules even though no capsule membrane is present. The binder dispersed electrophoretic display may be of the emulsion or phase separation type.

Throughout the specification, reference will be made to printing or printed. As used throughout the specification, printing is intended to include all forms of printing and coating, including: premetered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; and other similar techniques. A "printed element" refers to an element formed using any one of the above techniques.

In one aspect, the invention features an indicator. The indicator includes a substrate, a transducer, and an electrically addressable display printed on the substrate in electrical communication with the transducer. The transducer is, in some embodiments, printed on the substrate and, in other embodiments, is conventionally disposed on the substrate. The display shows a change in optical state in response to a signal from the transducer. In one embodiment, the indicator is a battery indicator. The battery indicator is in electrical communication with a battery and comprises an electrically addressable display printed on the battery. The optical state shows a first value in response to a voltage of the battery. In one detailed embodiment, the battery indicator includes an electrophoretic display comprising a microencapsulated display media, a first electrode and a second electrode disposed adjacent the electrophoretic display, a nonlinear element, a voltage divider, and a resistor. The first and second electrodes apply an electric field to the electrophoretic display media. The nonlinear element is in electrical communication with a battery and the first electrode. The nonlinear element conducts a battery voltage to the first electrode when the battery voltage exceeds a predetermined threshold. The voltage divider is in electrical communication with the battery and the second electrode. The voltage divider provides a voltage to the second electrode that is less than the battery voltage. The resistor is in electrical communication with the nonlinear element and the voltage divider.

In another aspect, the invention features a sticker display. The electrically active sticker display includes an encapsulated display media and an adhesive layer disposed on the first surface of the display media. In some cases, the encapsulated electrophoretic display may be itself sufficiently adhesive to function as a sticker without additional adhesive layers. The display media comprises an optoelectrically active material. In one embodiment, a transparent layer including an electrode is disposed adjacent a surface of the display media. In another embodiment, the sticker display further includes a via which extends from the transparent layer to the adhesive layer.

In still another aspect, the invention features a method of printing an electrically active display. The methods comprises the steps of: (a) providing a film having a clear electrode structure disposed on a first surface of the film; (b) printing a display media on the first surface of the film; and (c) printing or laminating a second electrode covering at least a portion of the display media. The display media comprises an encapsulated optoelectrically active material dispersed in a binder In still another aspect, the invention features a radio-controlled display. The radio controlled display includes an electrically active display having an encapsulated display media, a receiver, and a decoder in electrical communication with the receiver. The display is responsive to the output of the decoder. In one embodiment, the display further includes a power source in connection with the display. In another embodiment, the display further includes a plurality of row and column drivers disposed on the substrate for addressing the display. In still another embodiment, the display further includes an antenna in communication with a control circuit.

In still another aspect, the invention features a process for creating an electrically addressable display. The method comprises the steps of (a) providing a substrate; and (b) printing an electrically active ink comprising at least one microcapsule dispersed in a binder onto a first area of a receiving substrate. Optical qualities of the electrically active ink are modulated responsive to broadcast signals.

In still another aspect, the invention features a process for printing an electrically addressable display. The method comprises the steps of: (a) providing a substrate; and (b) printing an electrically active ink comprising at least one microcapsule dispersed in a binder onto a first area of the receiving substrate.

In still another aspect, the invention features an electrically active display tile. The tile includes a substrate, an electrically addressable display disposed on the substrate, a controller disposed on the substrate in electrical communication with the display, and a connector disposed on the substrate for connecting the display tile to another display tile. The display comprises a encapsulated display medium. In one embodiment, the display tile further includes a receiver for receiving radio signals or other electromagnetic radiation, and the controller changes the display in response to the received radio signals. In another embodiment, the display tile further includes a memory element storing data, and the controller changes the display responsive to data stored in the memory element.

In still another aspect the invention features a wearable display. A wearable display includes an article of clothing including an electrically addressable display incorporated into the wearable item and a controller in electrical communication with the display. The display comprises an encapsulated display media. In one embodiment, the controller is incorporated into the wearable item. In another embodiment, the wearable item comprises a fashion accessory. In still another embodiment, the wearable item includes an interface for receiving information from another device that can be displayed by the wearable item, such as a temperature monitor or position-sensing device.

BRIEF DESCRIPTION OF THE DRAWINGS

The invention is pointed with particularity in the appended claims. The advantages of the invention described above, together with father advantages, may be better understood by referring to the following description taken in conjunction with the accompanying drawings. In the drawings, like reference characters generally refer to the same parts throughout the different views. Also, the drawings are not necessarily to scale, emphasis instead generally being placed upon illustrating the principles of the invention.

DETAILED DESCRIPTION OF THE INVENTION

Figure 1:
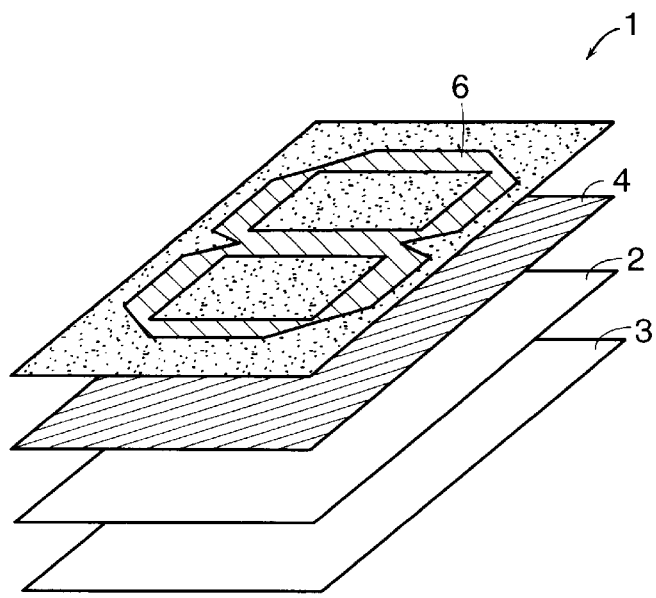
FIG. 1 shows an exploded view of one embodiment of a printed flexible electrophoretic display.

According to the present invention, a substrate is provided and an electronic ink is printed onto a first area of the substrate. The present invention takes advantage of the physical properties of an electronic ink which permits a wide range of printing and coating techniques to be used in creating a display. An electronic ink is an optoelectronically active material which comprises at least two phases: an electrophoretic contrast media phase and a coating/binding phase. The electrophoretic phase comprises, in some embodiments, a single species of electrophoretic particles dispersed in a clear or dyed medium, or more than one species of electrophoretic particles having distinct physical and electrical characteristics dispersed in a clear or dyed medium. The coating/binding phase includes, in one embodiment, a polymer matrix that surrounds the electrophoretic phase. In this embodiment, the polymer in the polymeric binder is capable of being dried, crosslinked, or otherwise cured as in traditional inks, and therefore a printing process can be used to deposit the electronic ink onto a substrate. An electronic ink is capable of being printed by several different processes, depending on the mechanical properties of the specific ink employed. For example, the fragility or viscosity of a particular ink may result in a different process selection. A very viscous ink would not be well-suited to deposition by an inkjet printing process, while a fragile ink might not be used in a knife over roll coating process.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer close to the top of the viewing surface. In this respect it resembles a common, printed image. Thus, electronic ink is easily viewed from a wide range of viewing angles in the same manner as a printed page. Such ink approximates a Lambertian contrast curve more closely than any other electronic display material. Since electronic ink can be printed, it can be included on the same surface with any other printed material. Electronic ink can be made optically stable in all optical states, that is, the ink can be set to a persistent optical state. Fabrication of a display by printing an electronic ink is particularly useful in low power applications because of this stability.

If desired, the colors of electronically active and non-active inks may closely match and the reflectivities may be similar. Electronic inks can be printed so that no border is noticeable between active and non-active inks. This is referred to as "color matching" or "color masking". Therefore, a display comprising an electronically active portion may appear as if it is not electronically active when the display is not being addressed and may be activated by addressing the display. Electronic inks are described in more detail in co-pending U.S. patent Application Ser. No. 08/935,800, the contents of which are incorporated herein by reference.

Referring to FIG. 1, a display 1 is created by printing a first conductive coating 2 on a substrate 3, printing an electronic ink 4 on the first conductive coating 2, and printing a second conductive coating 6 on the electronic ink 4. Conductive coatings 2, 6 may be Indium Tin Oxide (ITO) or some other suitable conductive material. The conductive layers 2, 6 may be applied from a vaporous phase, by electrolytic reaction, or deposition from a dispersed state such as spray droplets or dispersions in liquids. Conductive coatings 2, 6 do not need to be the same conductive material. In one detailed embodiment, the substrate 3 is a polyester sheet having a thickness of about 4 mil, and the first conductive coating 2 is a transparent conductive coating such as ITO or a transparent polyaniline. The second conductive coating 6 may be an opaque conductive coating, such as a patterned graphite layer. Alternatively, the second conductive coating 6 can be polymeric. The polymer can be intrinsically conductive or can be a polymer carrier with a metal conductor such as a silver-doped polyester or a silver-doped vinyl resin. Conductive polymers suitable for use as the second electrode include, for example, polyaniline, polypyrole, polythiophene, polyphenylenevinylene, and their derivatives. These organic materials can be colloidally dispersed or dissolved in a suitable solvent before coating.

In another embodiment, a display 1 is created by printing a first conductive coating 2 on a first substrate 3, printing an electronic ink 4 on the first conductive coating 2, printing a second conductive coating 6 on a second substrate 3', and configuring the substrates 3, 3' such that the second conductive coating 6 is in electrical communication with the electronic ink 4.

The electronic ink 4 comprises a plurality of capsules. The capsules, for example, may have an average diameter on the order of about 100 microns. Capsules this small allow significant bending of the display substrate without permanent deformation or rupture of the capsules themselves. The optical appearance of the encapsulated medium itself is more or less unaffected by the curvature of these capsules.

One of the benefits of using printing methods to fabricate displays is eliminating the need for vacuum-sputtered ITO by using coatable conductive materials. The replacement of vacuum-sputtered ITO with a printed conductive coating is beneficial in several ways. The printed conductor can be coated thinly, allowing for high optical transmission and low first-surface reflection. For example, total transmission can range from about 80% to about 95%. In addition, the printed conductive coating is significantly less expensive than vacuum-sputtered ITO. Another advantage of the encapsulated electrophoretic display medium is that relatively poor conductors, for example, materials with resistivities on the order of 103–1012 ohms square, can be used as lead lines to address a display element.

The flexible, inexpensive display described above is useful in numerous applications. For example, these, flexible displays can be used in applications where paper is currently the display medium of choice. Alternatively, the displays can be made into disposable displays. The displays can be tightly rolled or bent double. In other embodiments, the displays can be placed onto or incorporated into highly flexible plastic substrates, fabric, or paper. Since the displays can be rolled and bent without sustaining damage, they form large-area displays which are highly portable. Since these displays can be printed on plastics they can be lightweight. In addition, the printable, encapsulated electrophoretic display of the present invention can maintain the other desirable features of electrophoretic displays, including high reflectance, bistability, and low power consumption.

Figure 2:
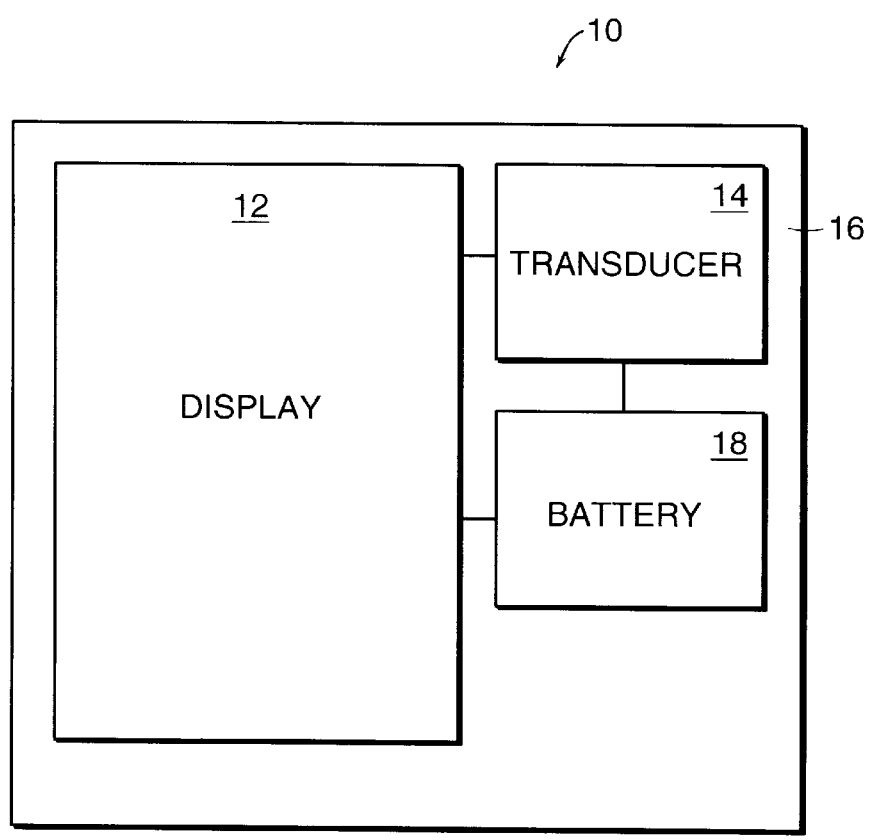
FIG. 2 shows a block diagram of an indicator prepared according to the present invention.

The printable display described above can be incorporated into a variety of applications. In one embodiment, the invention features a new type of indicator that can be printed in its entirety. FIG. 2 shows a block diagram of an indicator 10. The indicator 10 includes an electronically addressable display 12 which is capable of changing between at least two states, and a transducer 14 which is capable of generating an electrical event to trigger the change in the state of the display 12. The electronically addressable display 12 and the transducer 14 can both be printed onto a substrate 16. FIG. 2 depicts an embodiment in which the indicator 10 further includes a printed battery 18 to power the transducer 14 and the display 12. In one embodiment, the transducer 14 need not be printed. In this embodiment, a conventional transducer 14 may be placed on the substrate 16. The display media 12 is printed as described above. The media 12 may be printed before or after the transducer it is placed, provided that the display media 12 is ultimately in electrical communication with the transducer 14.

In another embodiment, the battery 18 is a conventional battery, the voltage of which is measured and displayed on the display 12. In one detailed embodiment, a battery indicator includes a printed display directly connected to a battery. The battery continuously addresses the display, but as the battery discharges over time, it eventually reaches a point where it is incapable of addressing the display. By varying the characteristics of the transducer, for example the number of amp-hours contained by the battery, the battery indicator can function as a "timer," so that the display shows a message such as "expired" after passage of a certain electrical charge.

Figure 3:
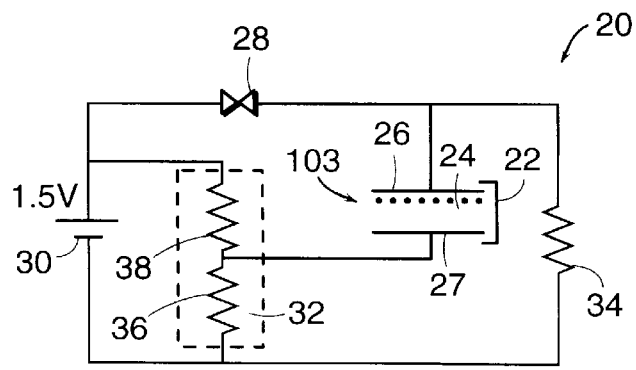
FIG. 3 shows a circuit diagram of an embodiment of a battery indicator.

FIG. 3 shows a circuit diagram of a battery indicator 20. The battery indicator 20 includes a display 22 comprising a display media 24, a first electrode 26 and a second electrode 27 disposed adjacent the display media 24, a nonlinear element 28 in electrical communication with the first electrode 26 and a battery 30, a voltage divider 32 in electrical communication with the battery 30 and the second electrode 27, and a resistor 34 in communication with the nonlinear element 28 and the voltage divider 32.

The battery 30 can be of any type. The battery 30 initially has a maximum voltage. The voltage divider 32 establishes a voltage potential that is some fraction of the battery cell voltage at the second electrode 27. In the embodiment shown in FIG. 2, the voltage divider 32 includes high impedance resistors 36 and 38. The voltage divider 32, for example, can have two 5 megaohm resistors to apply a voltage potential that is equal to one-half of the battery cell voltage to the second electrode 27. Alternatively, the battery indicator can have a sliding voltage divider. A sliding voltage divider may be provided as a potentiometer using a non-linear element to control the voltage applied to the display 24.

Figure 3A:
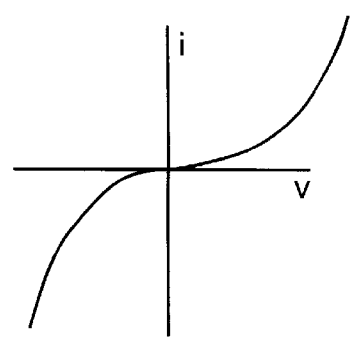
FIG. 3A shows a voltage-current curve of a non-linear element included in a battery indicator.

The nonlinear element 28 conducts voltage equal to the battery cell voltage to the first electrode 26 when the battery cell voltage exceeds the predetermined threshold voltage. Examples of suitable non-linear elements include a transistor, zener diode, varistor, metal-insulator-metal structure, organic semiconductors and devices based on materials like pentacene or regio-regular thiophene, or any other nonlinear devices known to those skilled in the art. FIG. 3A shows an exemplary current-voltage characteristic of a nonlinear element 28 which can be used in the battery indicator 20. The threshold voltage is adjustable through manufacturing, and the threshold is selected to be a voltage at which the battery 30 is still useable. As long as the battery 30 is above the threshold, the junction breaks down and the first electrode 26 is set at the battery cell voltage. A useful battery indicator should have a very low leakage current (e.g., much less than 1 microampere ($\mu$A)) and should allow at least about a hundred times as much current to flow when it is on than when it is off. The threshold voltage at which the state of the display changes depends on the battery with which the indicator is designed to work. A threshold voltage of about 8 volts (V) is typical for a 9 V alkaline. For example at 9 V, the device should pass 1 $\mu$A, at 8 V the device should pass 100 nanoamperes (nA), and at 7 V the device should pass 10 nA.

The voltage from the battery 30 which passes through the nonlinear element 28 and is applied to the first electrode 26, combined with the voltage from the battery 30 which passes through the voltage divider 32 and is applied to the second electrode 27, to provide an electric field across the display media 24 sufficient to activate the display 22. At least one of the first and second electrodes 26, 27 comprises a clear conductive material to permit viewing of the display 22. Alternatively, both electrodes may be placed on one side of the display media 24, eliminating the need for a clear electrode. Once the battery voltage 30 drops below the threshold, however, the potential at the first electrode 26 is drained through the resistor 34. Draining of the potential at the first electrode 26 changes the electric field across the display media 24 such that an electric field of opposite polarity is applied to the display media 24 and the appearance of the display 22 changes.

The resistor 34, for example, can be a 10 megaohm resistor for a typical 9 V battery. A typical 9 V battery has a 400 milliampere hour (mAh) rating. Over a 5 year period, there are 43,800 hours (5 years×365 days/year×24 hours/day=43800 hours). Thus, the indicator 20 must draw less than 1 (400mAh/43800 h) in order for the battery 30 to have a suitable shelf life. Ideally, the indicator 20 should draw less than 1 $\mu$A. In order to achieve such a low current draw, the impedance of the indicator 20 must be in the order of 10 megaohms.

As noted above, a circuit permanently connected to a battery should consume very little power. A number of display materials are suitable for such an application. However, some of these display materials, such as a liquid crystal display, require a more complex cell in their manufacture. In the present invention, encapsulated electrophoretic displays and encapsulated twisting ball displays are preferred as the display media 24 because of their low power draw, printability, and good contrast. Encapsulated electrophoretic display media, for example, includes a mixture of electrophoretic particles and a dye, or electrophoretic particles comprising multiple optical properties.

In one embodiment in which the battery indicator 20 operates by applying an electric field of one polarity while the battery is good, and then switching to the opposite polarity when the battery goes bad. Thus, the display media is not required to be bistable.

Figure 4A:
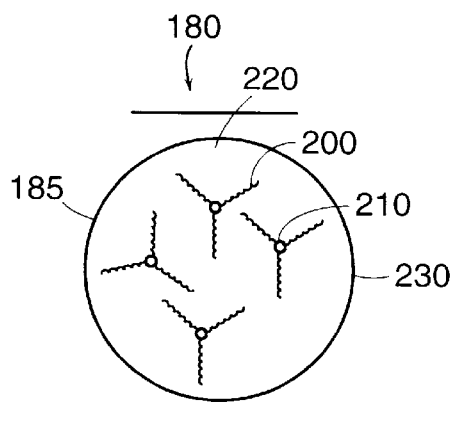
FIGS. 4A–4B show various embodiments of display media that is not bistable.

Referring to FIG. 4A, a display media 180 that is not bistable comprises at least one capsule 185, each filled with electrophoretic particles 210 and a fluid 220. Such media is useful in battery applications because the media will exhibit one contrast state when the display is addressed by the battery and a second contrast state when not addressed by the battery, i.e., when the battery voltage level falls below the threshold voltage necessary to address the display. In the embodiment depicted in FIG. 4A, electrophoretic particles 210 have polymer chain branches 200 which cause one particle 210 to repel another particle 210. In one detailed embodiment, the fluid 220 is dyed to provide a color contrast with the particles 210. When the display media is addressed, the particles 210 migrate towards an electrode with an opposite charge, thereby displaying the color of the particles 210. Once the display media is no longer being addressed, the particles 210 repel each other and redistribute within the fluid 220, thereby displaying the color of the fluid 220. This encapsulated display media 180 can be printed onto a substrate to form a display. Alternatively, an electrophoretic display that is not bistable can be formed by providing a standard display cell filled with electrophoretic media that is not bistable.

Figure 4B:
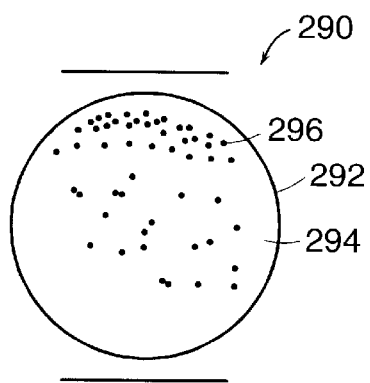

Referring to FIG. 4B, another display media 290 that is also not bistable includes at least one microcapsule or cell 292, filled with a plurality of metal sol 296 and a clear fluid 294. Metal sol 296 are particles which are smaller than a wavelength of light. In one detailed embodiment, the metal sol 296 comprises gold sol. When an electric field is applied across the microcapsule or cell 292, sol particles 296 agglomerate and scatter light. When the applied electric field is reduced to below a certain level, Brownian motion causes the sol particles 296 to redistribute, and the display media 290 appears clear from the clear fluid 294.

In another detailed embodiment, multiple indicators mapped to different voltage thresholds are used to create a battery indicator. An important element in this embodiment is a circuit element that provides a sharp non-linearity at a well-controlled voltage level.

In still another detailed embodiment, the battery indicator combines multiple non-linearities in order to provide a proper fit of the voltage curve for the open circuit voltage to be mapped to the closed circuit voltage. It is known that a battery with no load shows a voltage that is not the same as the loaded voltage. Therefore, non-linearity may be used to compensate for this difference. In addition, a known mapping of the closed circuit voltage to open circuit voltage may be used in the printed scale of the indicator.

In another detailed embodiment, the invention features a timer. A timer includes a junction formed of p-type semiconductor (e.g., boron doped) and an intrinsic or undoped semiconductor. In this device, current does not flow. However, if the intrinsic semiconductor becomes n-doped (i.e., if the semiconductor has extra electrons available from the valence shell of dopant atoms), then current could flow from the n-doped region to the p-doped region. Normally, intrinsic semiconductors become n-doped if doped with phosphorous. Alternatively, the same result can be achieved by embedding or placing in close proximity to the intrinsic region a beta particle emitting substance such as tritium. Likewise, the intrinsic region of an n-doped-intrinsic junction semiconductor may be treated with an alpha particle emitter such as Helium-5 to convert it to a p-doped region. Over time, a non-conducting junction with an alpha or beta particle emitter embedded in its intrinsic region transforms into a diode-type junction which passes current, thereby acting as a timer.

In another detailed embodiment, a timer employs a p-n junction semiconductor sensitive to light, such that light forces a current to flow from the n-region to the p-region. The timer can include a tritiated phosphor in a Zener diode and a display. A Zener diode is a diode designed to survive reverse breakdown. Light applied to the Zener diode through the tritiated phosphor increases the breakdown voltage of the Zener diode. When the tritiated system wears out, the Zener diode breakdown voltage decreases and voltage is applied to the display.

In another detailed embodiment, a pressure indicator includes a transducer and a display. In some embodiments, the transducer is printed. In other embodiments, the display is an encapsulated electrophoretic display. The transducer, for example, comprises a printed mechanical switch which closes once a certain pressure threshold is exceeded, thereby causing a printed display to change its state. In another example, pressure can change the electrical characteristics (e.g., the capacitance) of a circuit containing the display, thereby changing the state of the display once a threshold value has been exceeded. Alternatively, the transducer can provide power to switch the state of the display. One example of such a transducer is a piezoelectric element. In other embodiments, a solar cell may provide power to the display.

In another detailed embodiment, a heat indicator includes a display and a thermally-sensitive structure capable of changing the state of the display in response to a thermal stimulus. In some embodiments the structure is printed. In other embodiments the display is an encapsulated electrophoretic display. For example, a printed bimetallic mechanical system can serve as an electrical switch which changes the state of the printed display. Alternatively, a printed chemical structure which reacts to a thermal condition can be used to change the resulting electrical properties and the state of the display. Still another possibility is a transducer which provides power to switch the state of the display, for example, from an electrochemical potential. In other embodiments, a solar cell may provide power to the display.

In another detailed embodiment, a light indicator includes a display and a photosensitive structure capable of changing the state of the display in response to a photonic stimulus. In some embodiments the structure is printed. In other embodiments the display is an encapsulated electrophoretic display. For example, a printed solar cell array has a photovoltaic characteristic which is capable of providing a voltage to switch the state of the display in response to incident photons. Other structures which are sensitive to other radiative ranges (e.g. infrared, ultraviolet, etc.) could also be printed onto a substrate with the display. In other embodiments, a solar cell may provide power to the display.

In another detailed embodiment, a moisture indicator includes a display and a moisture-sensitive structure capable of changing the state of the display in response to humidity or direct aqueous contact. In some embodiments the structure is printed. In other embodiments the display is an encapsulated electrophoretic display. For example, a structure can be printed which is an open circuit until an ionic solution bridges two exposed electrical contacts, thus changing the state of the display. Alternatively, a chemical structure can be printed which, after the absorption of a certain amount of water, changes the electrical properties sufficiently to change the state of the display. This transducer can provide power to switch the state of the display, for example using an accumulated electrochemical potential. Useful materials for this purpose include polyvinylalcohol, poly-N-vinylpyrrolidone, polyvinylpyrrolidone, derivatives of these materials, starches, and sugars. In other embodiments, a solar cell may provide power to the display.

In still another detailed embodiment, a sound indicator includes a display and an acoustically-sensitive structure capable of changing the state of the display in response to an acoustical stimulus. In some embodiments the structure is printed. In other embodiments the display is an encapsulated electrophoretic display. For example, a mechanically resonating structure could be printed which changes the state of the display based on piezoelectrically generated energy, similar to a microphone. In other embodiments, a solar cell may provide power to the display.

In still another detailed embodiment, an angle indicator includes a display and a structure sensitive to orientation that is capable of changing the state of the display in response to a change in the orientation of the indicator. In some embodiments the structure is printed. In other embodiments the display is an encapsulated electrophoretic display. For example, a mercury switch type structure could be provided which closes two electrical contacts when a certain orientation has been reached. The orientation structure can also provide power to switch the state of the display. For example, the transducer can include a mechanical structure which converts a mechanical energy involved in angular rotation into an electrical energy. In other embodiments, a solar cell may provide power to the display.

In still another detailed embodiment, a pH indicator includes a display and a pH-sensitive structure capable of changing the state of the display in response to a change in the pH of a solution in which the indicator is immersed. In some embodiments the structure is printed. In other embodiments the display is an encapsulated electrophoretic display. For example, a chemical cell which undergoes a chemical reaction at a certain pH level can be printed and can change the state of the display. The pH-sensitive structure can also provide power to switch the state of the display. For example, an electrochemical potential can be generated by the chemical reaction. In other embodiments, a solar cell may provide power to the display.

In still another detailed embodiment, a chemical indicator includes a display and a chemically-sensitive structure capable of changing the state of the display in response to an external chemical interference. In some embodiments the structure is printed. In other embodiments the display is an encapsulated electrophoretic display. For example, a printed chemical sensor can be sensitive to an externally introduced agent which causes a chemical reaction to occur, and switches the state of the display. The chemically-sensitive structure can also provide power to switch the state of the display. For example, an electrochemical potential can be generated by the chemical reaction. In other embodiments, a solar cell may provide power to the display.

Additional transducers, other than those described above, that are capable of providing a signal to change the state of the display in addition to providing power to change the state of the display will be readily apparent to those of ordinary skill in the art.

In still another detailed embodiment, any of the above transducers can be connected to another transducer to create a multi-level transducer path which changes the state of display. For example, an indicator can include a chemically-sensitive structure, a thermally-sensitive structure, and a display, all of which may be printed on a substrate. Heat from an exothermic reaction created by the chemically-sensitive structure can be sensed by the thermally-sensitive structure, which in turn changes the state of the display and may also be used to power the display.

In another embodiment, an encapsulated electrophoretic display is used to create a printable, adhesive display. Referring to FIG. 5A, a printable, adhesive display 40 includes a substrate 42 coated with a conducting layer forming a top electrode 44, a display media 46 disposed adjacent the top conductor 44, and an adhesive 48 disposed adjacent the display media 40. The display media 40 comprises an optoelectrically active component 50 and a binder 52 which holds the optoelectrically active component 50 together. The substrate 42 and the top electrode 44 are optically transmissive to allow the display 40 to be viewed through the electrode. The substrate 42, for example, can be formed of a polymeric material such as a polyester. The top electrode 44, for example, can be formed of an inorganic material such as ITO or a suitable polymeric material. The optoelectronically active component 50, for example, can be an encapsulated electrophoretic display material. Alternatively, the optoelectronically active component 50 can be any other suitable display material such as biochromal microspheres or liquid crystals. The binder 52, for example, can be selected from polyurethanes, polyvinylalcohols, gelatins, polyacrylates, polystyrenes, polyvinylbutyrals, polyesters, epoxies, silicones, polycarbonates, their derivatives, and pressure-sensitive urethanes and adhesives.

In operation, the adhesive display 40 is attached to a receiving surface (not shown) by the adhesive 48. The receiving surface may include rear electrodes for addressing the optoelectronically active component 50. The rear electrodes may be electrically connected to drive or power circuitry for operating the display 40. In this embodiment, the display 40 is addressed in a "coupling" mode, where the top electrode 42 is "floating" and not directly tied to any specific potential.

Figure 5B:
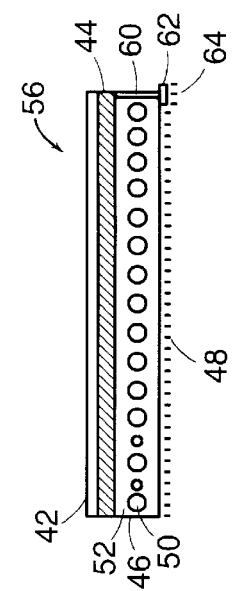
FIGS. 5A–5F show various embodiments of a sticker display.

Referring to FIG. 5B, an adhesive display 56 includes a substrate 42, a top electrode 44 disposed on the substrate 42, a display media 46 comprising an optoelectronically active component 50 and a binder 52, the display media 46 disposed adjacent the top electrode 44, and an adhesive 48 disposed adjacent display the media 46. In this embodiment, the adhesive display 56 further includes a via 60 which electrically connects the top electrode 44 to a pad 62 disposed on a rear surface of the display media 46, and a conductive adhesive 64 is disposed adjacent the pad 62. The rear electrodes are disposed on a receiving surface (not shown) to which the adhesive display 56 is applied. In this embodiment, the top electrode 44 may be directly connected to a specific potential.

Figure 5D:
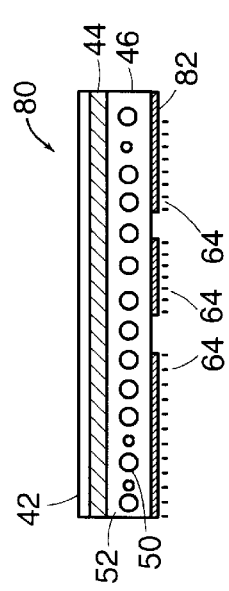
Figure 5F:
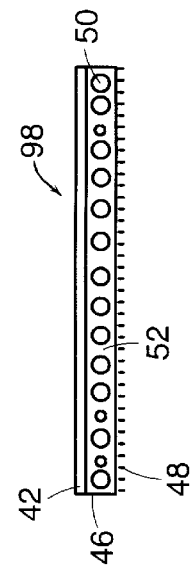
Figure 5A:
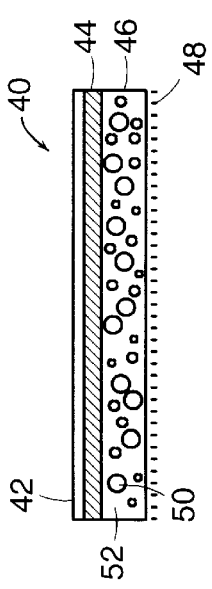
Figure 5C:
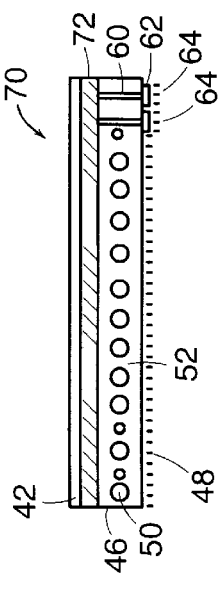

Referring to FIG. 5C, an adhesive display 70 includes a substrate 42, a patterned, optically-transmissive conducting layer 72 forming a plurality of top electrodes, the layer 72 coated on the substrate 42, a display media 46 comprising an optoelectronically active component 50 and a binder 52 disposed adjacent the substrate 42, and an adhesive 48 disposed adjacent the display media 46. The adhesive display 70 further includes at least one via 60 which electrically connects at least one top electrode 72 to a pad 62 disposed on a rear surface of the display media 46. A conductive adhesive 64 may be disposed adjacent the display media in the general location of the pads 62. The rear electrodes may be disposed on a receiving surface (not shown) to which the adhesive display 70 is applied.

Referring to FIG. 5D, an adhesive display 80 includes a substrate 42, a continuous top electrode 44 disposed on the substrate 42, a display media 46 comprising an optoelectronically active component 50 and a binder 52 disposed adjacent the top electrode 44, at least one patterned rear electrode 82 disposed adjacent a rear surface of the display media 46, and conductive adhesive 64 disposed adjacent the rear electrodes 82 for adhering the display 80 to a receiving surface (not shown). In this embodiment, the receiving surface may include drive or power circuitry for operating the display 80. In this embodiment, the display 80 is addressed in a "coupling" mode where the top electrode is "floating."

Figure 5E:
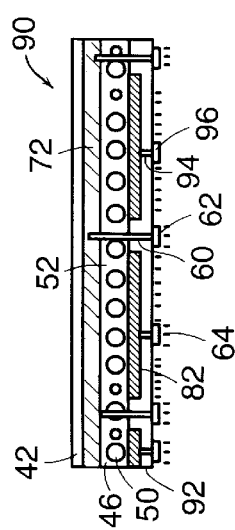

Referring to FIG. 5E, an adhesive display 90 includes a substrate 42, at least one patterned top electrode 72 disposed on the substrate 42, a display media 46 comprising an optoelectronically active component 50 and a binder 52 disposed adjacent the top electrode 72, at least one patterned rear electrode 82 disposed adjacent a rear surface of the display media 46, and a dielectric layer 92 disposed adjacent the rear electrodes 82. The adhesive display 90 further includes at least one via 60 which extends from a top electrode 72 through the display media 46 and the dielectric layer 92 to at least one pad 62 disposed on a rear surface of the dielectric layer 92. The adhesive display 90 further includes at least one via 94 which extends from a rear electrode 82 through the dielectric layer 92 to at least one pad 96 disposed on a rear surface of the dielectric layer 92. Conductive adhesive 64 is disposed in the general location of the pads 62 and 96 to adhere the display 90 to a receiving surface and to provide electrical communication between circuitry on the receiving surface and the electrodes 72, 82 of the display 90. The display 90 can further include a nonconductive adhesive 48 disposed adjacent the exposed dielectric layer 92 to further assist in adhering the display 90 to the receiver.

Referring to FIG. 5F, an adhesive display 98 includes a substrate 42, a display media 46 comprising an optoelectronically active component 50 and a binder 52 disposed adjacent the substrate 42, and an adhesive 48 disposed adjacent a rear surface of the display media 46. In this embodiment, the display 98 is addressed by rear electrodes (not shown) only. The rear electrodes are disposed on a receiving surface to which the display 98 is applied. Alternatively, the rear electrodes may be disposed on a rear surface of the display 98 as shown in FIGS. 5D and 5E.

In the embodiments described above, a stylus may be provided that acts as the top electrode to address the adhesive display 40. In this embodiment, the stylus may be scanned over the entire display to address it. Alternatively, the stylus may be used as a writing utensil, addressing only specific portions of the display over which it is passed.

Figure 6A:
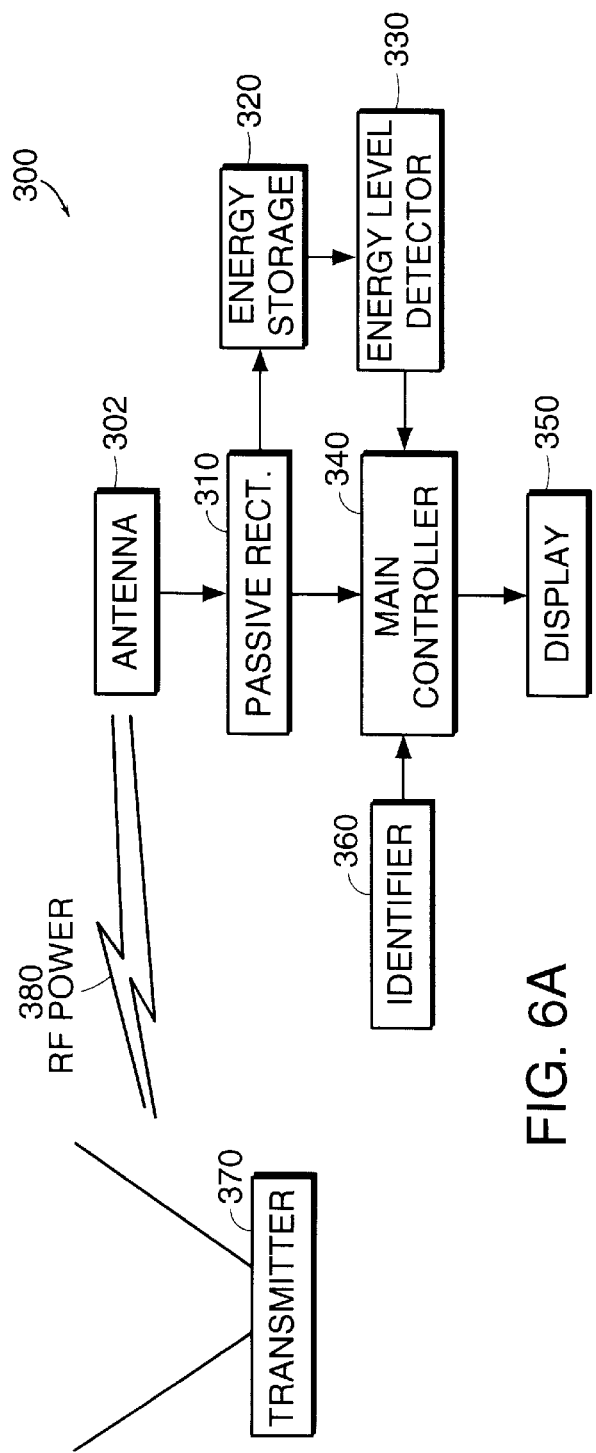
FIG. 6A shows a flow chart illustrating how one embodiment of a radio-controlled display functions.

In another embodiment, an encapsulated, electrophoretic display is used to form a radio-controlled display system. Referring to FIG. 6A, the radio-controlled display system 300 includes a remote transmitter 370, a receiver 301, a controller 340, and a display unit 350. In one embodiment, the receiver 301 includes an antenna 302. In one more particular embodiment, the receiver 301 is in electrical communication with a passive rectifier 310 which transforms and rectifies energy received by the antenna 302. The antenna 302 can be a monopole antenna, a dipole antenna, a planar array, a coil or any other antenna structure known in the art of radio reception.

Figure 6B:
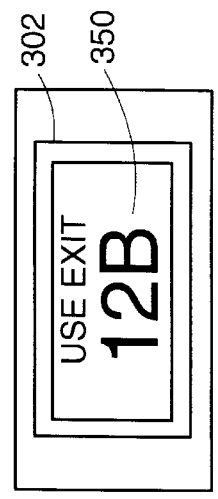
FIG. 6B shows one embodiment of a radio-controlled display.

As shown in FIG. 6B, the antenna 302 may be disposed in a surrounding relation to the display 350, allowing power to be received from relatively low-power signals. For example, an antenna having a cross-sectional area of 0.1 square meters that receives a 10,000 watt signal at a distance of 5,000 m can receive 3 microwatts of power. In other embodiments the display 350 is powered by a solar cell (not shown).

In one embodiment, the antenna 302 includes a plurality of antennas to improve the reception level. The display system 300 further includes an energy storage device 320 in communication with the passive rectifier 310. The energy storage device 320 can be a capacitor, a battery, or any other electrical or non-electrical energy storage device known in the art of energy storage. In the case of a non-electrical energy storage, a transducer can be used to transfer electrical energy into another form of energy.

When the energy level in the energy storage device 320 reaches a certain level as detected by an energy level detector 330, the controller 340 is activated and the display can be updated. The controller 340 decodes the radio signals received by the antenna 302 and updates the display 350 based on the information received by the antenna 302. Each display 350 can have a unique identification code 360 that may be stored as dip switch settings or as programmed data in a semiconductor device such as a PROM or Flash RAM as in cellular phones or beepers. The controller 340 looks for this identification number 360 and updates the display 350 with the information on the attached data stream if a match between the transmitted ID code and the stored identification number 360 is made.

In a preferred embodiment, the display 350 is a low power display. For example, a bistable, non-emissive display, such as an electrophoretic display can be used. In one detailed embodiment, a encapsulated, electrophoretic display, which is inexpensive and easy to manufacture into a finished product, can be used.

In one detailed embodiment, the radio-controlled display forms a radio sign that can be updated using information sent via radio-frequency energy. The sign includes a surface covered with a display material and control circuitry. This control circuitry receives broadcast energy. The circuitry decodes the information and updates the sign with that information.

The display material, for example, can be an encapsulated, electrophoretic display or any other encapsulated display material known to those skilled in the art. These display materials can be printed using traditional printing technology, thus facilitating and lowering the cost of sign manufacture. Radio signs can be used in stores, airports, train stations, on roads, supermarkets, at conventions, as billboards, or as any other signs where updating the signs or powering the signs may be best done remotely. Content may be updated using any form of electromagnetic radiation. These signs can use solar cells, batteries, or a hardwired source of power. These signs may be in two color, three color, four colors, or full color.

A color display may be fabricated with a multi-step printing process. For example, the first four steps can be a traditional four-color screen printing process to lay down an elaborate border or various static information that will not change throughout the lifetime of the device. The next step can be printing an electronic ink, which may be selected to match exactly the resultant colors from the four-color process. In some embodiments, a top electrode is disposed on the printed electronic ink. The top electrode may also be printed using conventional printing techniques.

In one detailed embodiment, the electronic ink comprises encapsulated electrophoretic ink which includes $TiO_2$ particles mixed into an organic fluid. The organic fluid, for example, may contain a colored dye. The organic dispersion is emulsified into an aqueous solution and encapsulated using any of known encapsulation procedures known to those skilled in the art. Examples of such materials include gelatin-gum arabic or urea-formaldehyde microcapsules. In this embodiment, the capsules are blended with a binding material to form a printable electronic ink suspension.

In another embodiment, a color display may be fabricated using a lamination process. In this embodiment, static information is printed on a first substrate. In this embodiment, the first embodiment includes at least one clear, or substantially clear, aperture. An encapsulated electrophoretic display is laminated to the printed substrate so that the display aligns with the aperture.

Figure 7:
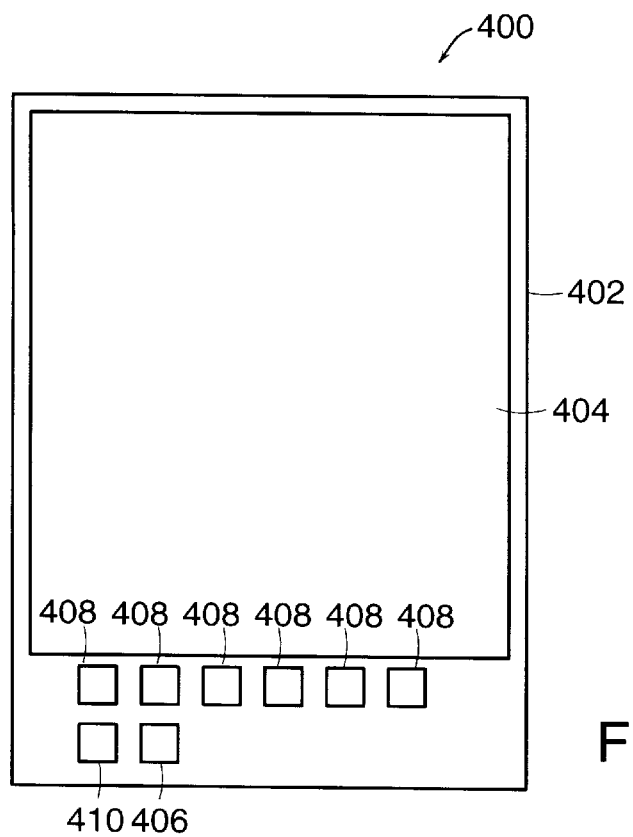
FIG. 7 shows one embodiment of a radio paper.

In another detailed embodiment, a radio-controlled display forms a device capable of receiving broadcast data for individual consumption, referred to herein as a radio paper. The content may be customized for an individual, and a consumer of information could pay for such customized content using an electronic payment scheme. Radio paper may be two-color (e.g. black and white) or full color, as described above. Transactions for content may take place over one or more computer networks, including the world-wide computer network known as the Internet. Referring to FIG. 7, a radio paper 400 includes a substrate 402, a display 404 disposed on the substrate 402, a receiver 406 disposed on the substrate 402, and control circuitry 408 disposed on the substrate 402. The display 404 can be printed onto the substrate 402. Alternatively, flip chip technology can be used to mount a silicon substrate 402 to a display substrate 404. The control circuitry 408 can be created directly on the substrate 402 using low temperature polysilicon process. A plurality of row and column drivers can be interfaced to the backplane of the display 404 for addressing the display 404. In one detailed embodiment, the radio receiver 406 includes traces disposed on the substrate 402. In another detailed embodiment, the radio receiver 406 includes an antenna mounted on the substrate 402. The radio paper 400 can further include a power source 410 disposed on the substrate 402. The power source 410, for example, can be a solar cell, a thin film battery, or a standard cell.

The radio paper described above can be used to provide a wireless updatable document. The device includes: a document cover; an electronic display on any surface of the cover; and a data receiver. The display is fed by data from the data receiver. The display is visible to the document user and represents a way for the document to be messaged subsequent to its delivery. The device can be provided as a leaflet, book, magazine, circular, periodical, catalogue, directory or item containing a document cover. Ideally the electronic display of the device should operate using very low power and be easily visible. The general class of reflective electronic displays are desirable for this reason. Further ideally the display would be bistable, as described above, in order to minimize power draw. In addition, ideally the display would be flexible and paper-thin to maximize the number of ways in which the display could be incorporated. For example, a paper-thin substrate would allow the radio paper to be addressed by a desktop unit such as a laser printer. Alternatively, the radio paper could be addressed using a stylus that can be passed over the display. An encapsulated electrophoretic display meets all of the stated requirements, and may be used beneficially for this purpose.

The data receiver may be any device capable of receiving information via electromagnetic radiation. In some particular embodiments, the data receiver is a pager or other radio receiver. In other embodiments the data receiver may receive data via a physical connection, such as coaxial cable.

The device may operate by battery power. In this case, the device may incorporate an appropriate sleep mechanism that causes the receiver to only be powered for reception during certain moments of the day when messages are expected to be sent, such as low traffic periods where bandwidth is cheaper. The device may also incorporate a solar cell to eliminate or reduce the need for batteries.

An example of the usefulness of this device can be shown by reference to a chain of retail stores that distributes the device as a catalogue. After shipping the catalogue, the retailer may determine certain inventory items must be liquidated. This typically requires costly marketing efforts. Instead, using the device, the chain may advertise the items to be liquidated and may in fact refer the customer to specific pages of the catalogue. The chain may also promote events at the retail store and drive traffic to the store. The chain may also run various messages to different customer segments to evaluate offers and marketing messages on a trial basis.

Ideally the device may be addressed either individually or as part of a group of devices. In the former case this permits targeted marketing and in the latter case this saves on bandwidth transmission costs.

In still another embodiment, an encapsulated electrophoretic display is used to form a tile display, which allows creation of a large area display by interconnecting a plurality of tile displays. The tile displays, when assembled, may or may not be seamless. Tile pixels may have any shape such as circular, rectangular or other shapes, for example, shapes present in a mosaic font display. There may be a pixel mask applied in front of the pixels.

Referring to FIGS. 8A–8D, a tile display system 800 includes a plurality of tile displays 801, 802, 803 and 804 and a controller (not shown). Each tile display 801 includes means for connecting the tile display 801 to an adjacent tile display 802, 803, 804. The tile display system 800 may include any desired number of tile displays. In one embodiment, the tile display system includes 40×30 grid of 16×16 pixel tiles to form a VGA resolution screen.

In one detailed embodiment, the tile display system comprises a direct connect structure, that is, each pixel has its own lead line from the controller. Each lead line may be a discrete or packaged transistor line. In this embodiment, a front surface of the substrate comprises of a grid of electrodes, where each electrode is connected through a via to the output of a control chip. Thus, for an N×N grid, $N^2+1$ control lines are needed. The additional line is used to connect to a continuous top electrode.

A matrix display using 2N+1 control lines can be built with a plurality of tile displays using a variety of techniques. In one embodiment, an array of varistors, metal-insulator-metal, or discrete diodes are used for individually addressing each pixel. In the case of diodes, discrete, surface-mount zener diodes are useful. For an N×N grid matrix display, using a matrix of two terminal devices, only 2*N+1 control lines are needed to control the tiles.

In one detailed embodiment, the tiles are connected to each other using standard electronics connectors 805 placed on the edges of the tiles 801 as shown in FIGS. 8A–8D. In another detailed embodiment, the tiles are connected to each other using cables. The tiles can be mounted to a wall, lightweight metal grid, or any other substrate using nuts soldered onto the back of the tiles or by any other means known in the art of fastening substrates.

The controller includes a microprocessor or other suitable drive circuitry. The controller transmits information to the tile displays to update the displays using any convenient form of electromagnetic radiation. In some embodiments the controller also receives information from the tile displays. Data for the display system may be stored in a memory element of the controller or may be received in the form of electromagnetic signals using a receiver. The receiver, for example, can include an antenna and a passive rectifier in communication with the antenna, as described above.

In one embodiment, the controller connects to a single tile and controls the entire display. The controller can consist of a battery, a power supply, a paging receiver, and a microprocessor to control the entire system. The display can be powered, for example, using commercially available integrated AC to DC converters. In one embodiment, each tile may have its own high voltage supply. Common inverter chips for use in electroluminescent backlights can be used in this embodiment.

One method of controlling the entire tile system is to have a microcontroller on each tile. In this embodiment, the sign controller tells the one tile it is connected to that it is at a certain coordinate location, say 0,0. Due to the asymmetrical connector layout, the tile can determine to which edge the controller is connected. That tile then communicates with its neighbors, incrementing or decrementing the coordinate location appropriately. Through this protocol, each tile can determine a unique identification code that specifies its location on the sign. The sign controller can then send data out on a common bus and each tile's microcontroller can receive data needed to update the tile. When the appropriate data appears on the bus, the microcontroller shifts this data out to the display drivers. Then, the entire sign is given a write pulse and the entire display is updated. The tile display as described above may be successfully driven with a voltage as low as 3 volts.

In one embodiment, the tile display is driven by controlling each pixel and the top electrode. To display an image, the electrodes of the backplane are set to the proper pattern of voltages. The rear electrode segments are set at either ground or power and the top electrode is switched rapidly between ground and power. In the state where the top electrode is at power, the areas of the display that have a potential of ground will be addressed and there will no field elsewhere. When the top electrode is switched to ground, the other areas of the backplane that are at power will be switched. This method allows the backplane to maximize the voltage that the display material will receive. Alternatively, a standard bipolar addressing scheme may be used on the rear electrodes, with the top electrode held at ground potential.

In one embodiment, high voltage CMOS display drive circuitry, such as HV57708PG manufactured by Supertex Corporation (Sunnyvale, Calif.) can be used to drive the tile display. The HV57708PG is an 80 pin plastic gull wing surface mount chip that has 64 outputs. Each output can sink 15 mA. Four of these chips can control a single tile. Other chips may find utility in the context of the present invention, such as the Sharp LH1538 which is an 80V 128 line Tape-Automated-Bonding (TAB) chip.

Figure 8B:
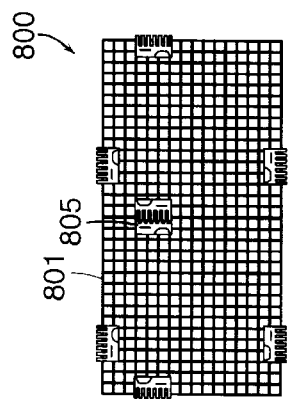
FIGS. 8A–8D depict a tile display system.
Figure 8B:
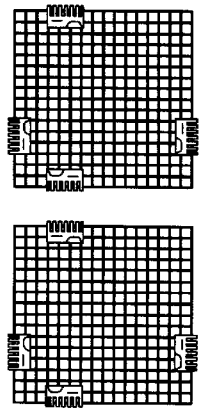
Figure 8D:
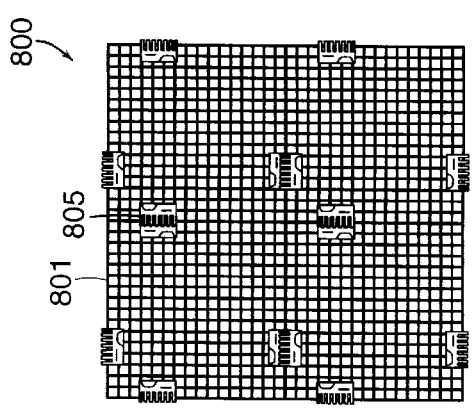
Figure 8A:
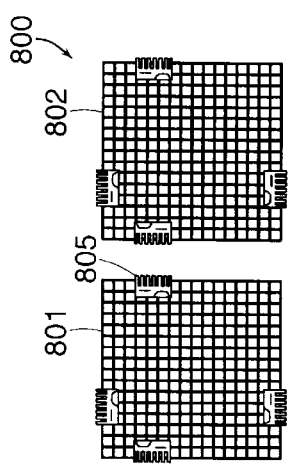
Figure 8C:
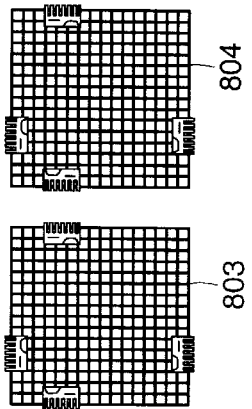
Figure 8C:
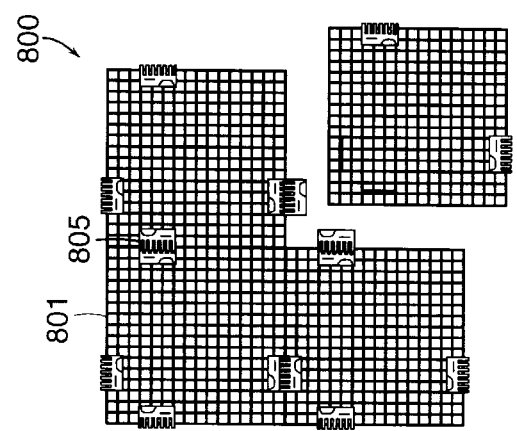
Figure 8E:
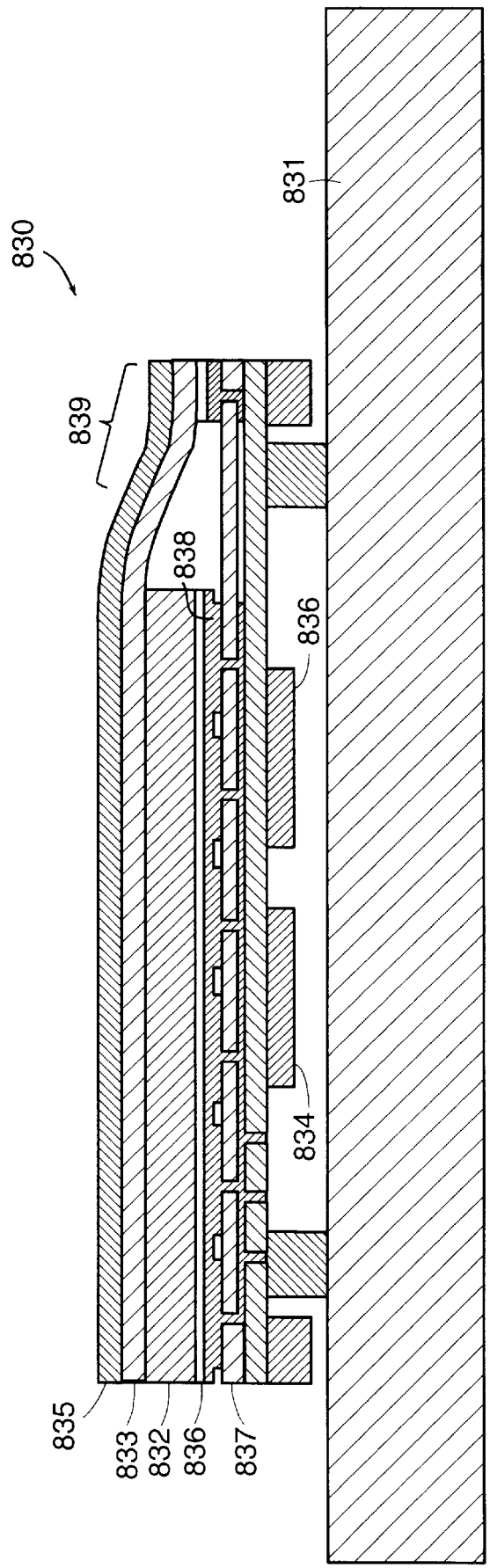
FIG. 8E shows one embodiment of a block diagram of a tile display.

Referring to FIG. 8E, a tile display 830 includes a substrate 831, and a display media 832, electronics 834, and driver circuitry 836. The tile display 830 may be of any convenient size and may have any desired number of pixels. In one embodiment, the tile display 830 is 8 inches by 8 inches, and is a matrix of 16×16 pixels. The substrate 831 of the tile display 830 can be: a standard, etched printed circuit board; copper clad polyimide; polyester with printed conductive ink; or any other suitable substrate with patterned conductive areas. A display media 832 such as a encapsulated electrophoretic display media can be printed on a front surface of the substrate. The display media 832 can be a encapsulated electrophoretic suspension consisting of a slurry of capsules in a binder. Each capsule includes a mechanical system consisting of a dielectric suspending fluid and many particles. When an electric field is applied across the capsule, the particles are caused to move in the field. By using two different particle species of different charge and color such as black and white, the viewer can be presented with a color change. In one embodiment, the material is bistable, so that once it is addressed, it stays in its last state. This is used to eliminate power draw between image updates. The material responds purely to the field, thus the only real current draw is in changing the charge of the plates on either side of the material. The capacitance of the display material can be between 0.1 and 100 picofarads per square centimeter. The capacitance will vary with differences in the display material, binder, and overall thickness.

In one detailed embodiment, the display media is printed on a substrate and then covered with a layer of plastic or glass with a clear conductive coating such as ITO-coated mylar. Necessary connections to the ITO can be made using conductive adhesives, contacts, or tapes.

In the embodiment shown in FIG. 8E, the tile display 830 is prepared using the following steps. An electronic ink which forms the display media 832 is coated onto a conductive side of a sheet of ITO-sputtered mylar 835 and then dried or cured. A layer of conductive adhesive 836 is optionally applied to the cured electronic ink 832 forming a laminate. This laminate is adhered to a backplane 837 made of a circuit board having copper pads 838 or a screen-printed metallic inks disposed on its surface. The corners, or one edge 839 of the tile display 830, are reserved to allow connections to be made between the front ITO electrode 833 and the backplane 837. If necessary, the electronic ink 832 is removed from the corners 839 and a connection is made using a conductive adhesive 836 such as silver loaded epoxy or a conductive heat seal.

Figure 9:
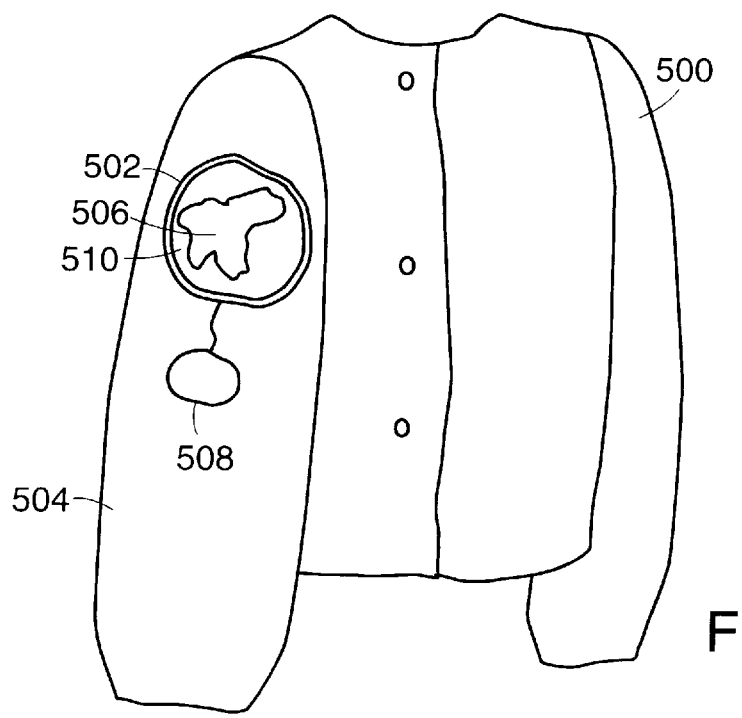
FIG. 9 shows one embodiment of a wearable display.

In still another embodiment, encapsulated electrophoretic displays are incorporated into clothing to provide a wearable display. Referring to FIG. 9, a wearable display 502 is embodied as a patch on the arm 504 of a jacket 500 providing weather maps 506 or other information. The wearable display 502 includes a controller 508 in electrical communication with a display monitor 510 comprising a encapsulated, electrophoretic display media and a backplane. The display media is printed onto the backplane. The backplane further includes electronics necessary for addressing the display 502. In some embodiments, the wearable display is in communication with at least one device that provides data for display, such as a global positioning unit, news feed, or a pager. In these embodiments, the data device communicates information to the display which then displays the information for the wearer.

Wearable displays can be incorporated into other wearable items such as shoes, socks, pants, underwear, wallets, key chains, shoe laces, suspenders, ties, bow ties, buttons, buckles, shirts, jackets, skirts, dresses, ear muffs, hats, glasses, contact lenses, watches, cuff links, wallet chains, belts, backpacks, briefcases, pocket books, gloves, raincoats, watchbands, bracelets, overcoats, windbreakers, vests, ponchos, waistcoats, or any other article of clothing or fashion accessory.

In still another aspect, the invention features a communications system. The communications system enables a whole new messaging and communication medium that permits its users to display messages in real time in practically any location.

Figure 10:
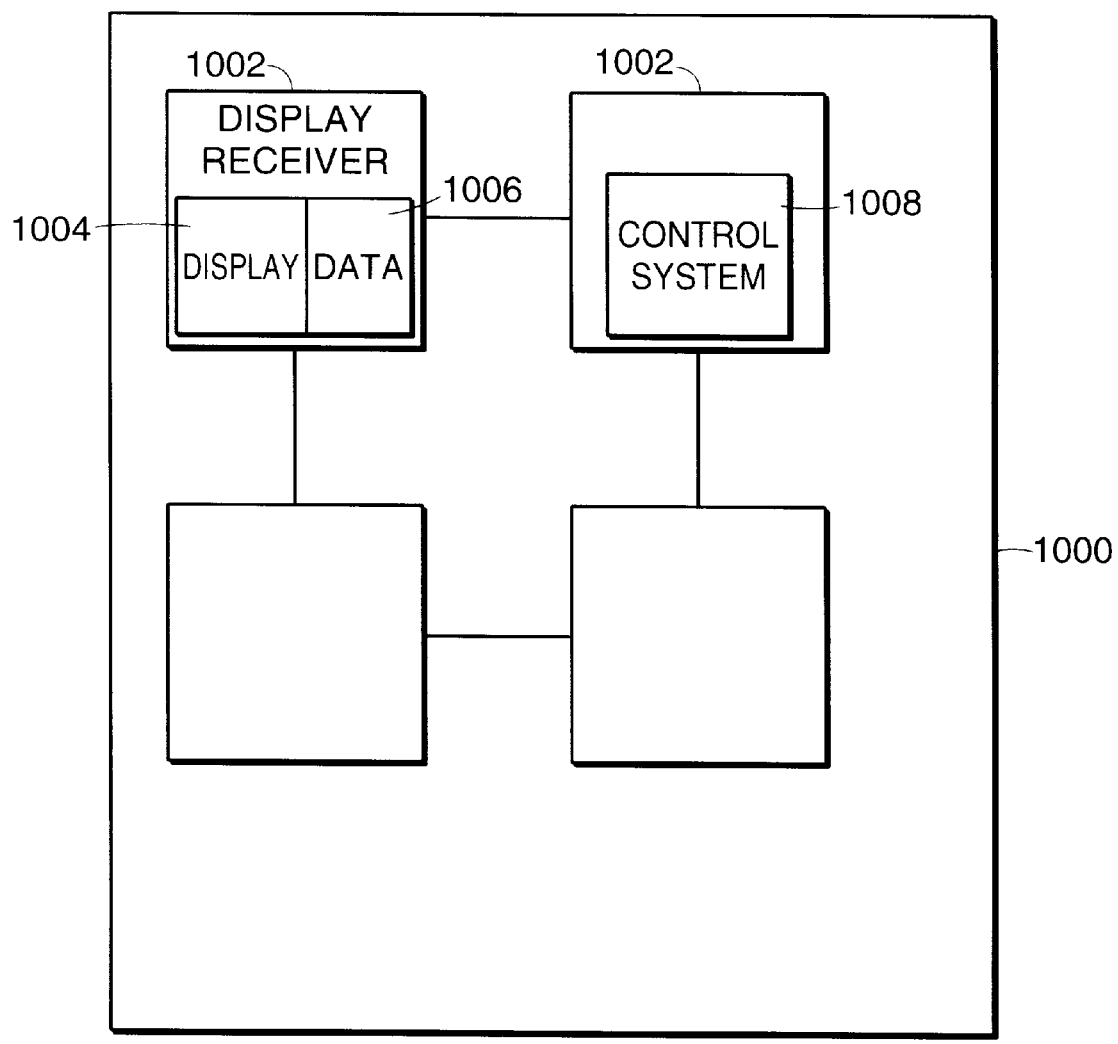
FIG. 10 shows a block diagram of one embodiment of network data displays.

Referring to FIG. 10, the system 1000 comprises a plurality of display receivers 1002. The display receivers 1002 include an electronic display 1004 and a data receiver 1006. In certain embodiments, the display receivers are tile displays or radio papers, as described above. The electronic display 1004 can operate by principles known to the art of LCDs, plasma displays, CRTs, electrophoretic displays or encapsulated electrophoretic displays. The encapsulated electrophoretic display may be coated onto many different surfaces practically any surface using appropriate binders such as PVCs, urethanes and silicon binders, allowing them to be: made in large sizes (such as poster and billboard sizes) using coating techniques; lightweight enough to install without an overhead crane; flexible enough to bend with wind; and capable of holding an image without further power draw, thereby operating economically from solar cells or batteries.

The data receiver 1006 may be, for example, a pager, cellular phone, satellite phone, radio-frequency receiver, infrared receiver, cable modem, or any other suitable receiver that is able to receive information from another source. The data receiver 1006 can transmit as well as receive information; for example the data receiver 1006 may transmit verification information to confirm that a new data stream was received. The data receiver 1006 may transmit data as may be useful for the overall operation of the system 1000, for example weather data as part of a national weather system. The data receiver 1006 may use varying or multiple transmission methods for both receiving and transmitting data.

The function of the data receiver 1006 is primarily to receive data and to display text or images in response. The data can include a message, a stream of messages, codes describing how the device should display or transition between the messages, or any other suitable information that will cause the display 1004 to operate as desired by the user. The data can also include a header, error-checking, checksum, routing or other information that facilitates the function of the system 1000.

In one embodiment, the data receiver 1006 includes a control system 1008. The control system 1008 facilitates the operation of the communications system 1000. In one embodiment, the control system 1008 functions as a user interface that permits the user to design, author, test, collaborate, approve and/or transmit images and commands that are sent to the display receivers. In another embodiment, the control system 1008 functions as a billing and authorization system that monitors the user's activity, verifies payment has been received, verifies that the account is in good standing, verifies that the user has proper authorization, creates usage reports, generates invoices, and/or updates data receivers due to unsatisfactory billing status. In another embodiment, the control system 1008 functions as a data receiver management system that tracks data receivers, generates reports of data receiver history and status, permits sorting and screening of data receivers based on suitable characteristics, and/or permits the user to assign messages to the entire network of data receivers or subsets thereof. In still another embodiment, the control system 1008 functions as a data transmission system that preprocesses data into a format suitable for the data receivers or subsets thereof, transmits the data by the method necessary or most suitable for each data receiver, schedules the transmission of the data according to desired criteria, verifies that the data was properly sent, receives and processes any information uploaded from the data receivers 1006, resends messages that may not have been received, generates reports of such activities, and/or generates messages to field personnel indicating potential service requirements.

In all of the above embodiments, the control system may utilize the Internet or the World Wide Web as a user interface, as a data transmission mechanism, as an error-checking protocol, as a messaging service, as a programming environment or in any suitable fashion. The control system 1008 may also utilize data encryption mechanisms for enhanced security in the user interaction, in the system operation, in the data receiver transmission or in the data receiver reception. The control system 1008 may also utilize a suitable digital payment scheme to enable funds to be transferred as a part of the overall system of usage and operation.

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. An indicator comprising:

a substrate;

a transducer disposed on the substrate the transducer producing signals in response to a stimulus; and an encapsulated electrophoretic display printed on the substrate in electrical communication with the transducer, the display displaying a visible optical state indicative of the presence of the stimulus in response to the signals from the transducer.

2. The indicator of claim 1, wherein the transducer comprises an electrical junction having a current-voltage characteristic that changes as a function of time.

3. The indicator of claim 1, wherein the transducer comprises a mechanical system responsive to a change in pressure.

4. The indicator of claim 1, wherein the transducer comprises a thermally responsive structure.

5. The indicator of claim 1, wherein the transducer comprises a photosensitive structure.

6. The indicator of claim 1, wherein the transducer comprises a structure responsive to moisture.

7. The indicator of claim 1, wherein the transducer comprises an acoustically responsive structure.

8. The indicator of claim 1, wherein the transducer comprises a structure responsive to the orientation of the substrate.

9. The indicator of claim 1, wherein the transducer comprises a pH sensor.

10. The indicator of claim 1, wherein the transducer comprises a chemically sensitive structure.

11. The indicator of claim 1, wherein the transducer comprises a printed structure.

12. A battery indicator for use on a battery comprising:

an electrically addressable display printed on a substrate in electrical communication with the battery, wherein the display displays a first optical state in response to a voltage of the battery indicative of the voltage of the battery.

13. The battery indicator of claim 12, wherein the display displays a second optical state when the voltage applied by the battery falls below a predetermined threshold.

14. A battery indicator comprising:

an electrophoretic display comprising an encapsulated display media;

a first electrode and a second electrode disposed adjacent the electrophoretic display, a nonlinear electrical element in electrical communication with a battery and the first electrode, the nonlinear electrical element conducting a battery voltage to the first electrode when the battery voltage exceeds a predetermined threshold;

a voltage divider in electrical communication with the battery and second electrode, the voltage divider providing a voltage to the second electrode that is less than the battery voltage; and a resistor in communication with the nonlinear electrical element and voltage divider, wherein the display displays a first optical state in response to the voltage of the battery that is indicative of the voltage of the battery.

15. The battery indicator of claim 14, wherein the display comprises a capsule including at least one electrophoretic particle and a dye.

16. The battery indicator of claim 14, wherein the display comprises a capsule including a first plurality of electrophoretic particles having a first optical property and first electrophoretic mobility distribution and a second plurality of electrophoretic particles having a second optical property and a second electrophoretic mobility distribution.

17. The battery indicator of claim 14, wherein the display comprises an encapsulated, bistable display media.

18. The battery indicator of claim 14, wherein the voltage divider comprises two high-impedance resistors.

19. The battery indicator of claim 14, wherein the nonlinear element comprises a diode.

20. The battery indicator of claim 14 further comprising a resistor in electrical communication with the nonlinear device and the second electrode.

* * * * *

UNITED STATES PATENT AND TRADEMARK OFFICE
CERTIFICATE OF CORRECTION

PATENT NO. : 6,118,426  
DATED : September 12, 2000  
INVENTOR(S) : Albert et al.

It is certified that error appears in the above-identified patent and that said Letters Patent is hereby corrected as shown below:

Title page,
Under "Related U.S. Application Data," please replace "which is a continuation-in-part of application No. 08/983,404, Jul. 19, 1997" with --and a continuation-in-part of application No. 08/983,404, Jul. 19,1996--;

In the specification
Column 1,
Line 8, please delete "1997" and replace with --1996--;
Line 18, please delete "abandoned".

Column 6,
Line 48, please delete "polypyrole" and insert in its place --polypyrrole--.

Column 7,
Line 44, please insert the words --adjacent which-- after the word "transducer".

Column 8,
Line 18, please delete the word "zener" and insert in its place --Zener--;
Line 20, please delete the word "thiophene" and insert in its place --polythiophene--;
Line 61, please insert --µA-- after the numeral "1".

Column 9,
Line 42, please delete "296 are" and uinsert in its place --296 comprises--.

UNITED STATES PATENT AND TRADEMARK OFFICE
CERTIFICATE OF CORRECTION

PATENT NO.    : 6,118,426
DATED         : September 12, 2000
INVENTOR(S)   : Albert et al.

It is certified that error appears in the above-identified patent and that said Letters Patent is hereby corrected as shown below:

Column 12,
Line 34, please delete the word "biochromal" and insert in its place --bichromal--;
Line 67, please insert the word --being-- after the numeral "72".

Column 14,
Line 44, please delete the word "a" and insert in its place --an--;
Line 67, please delete the words "two color, three color," and insert in their place --two colors, three colors--.

Column 15,
Line 66, please delete the word "are" and insert in its place --is--.

Column 18,
Page 15, please delete the word "a" and insert in its place --an--;
Line 17, please delete the first occurrence of the word "a" and insert in its place --an--;
Line 38, please delete the word "mylar" and insert in its place --Mylar--;

UNITED STATES PATENT AND TRADEMARK OFFICE
CERTIFICATE OF CORRECTION

PATENT NO. : 6,118,426
DATED : September 12, 2000
INVENTOR(S) : Albert et al.

It is certified that error appears in the above-identified patent and that said Letters Patent is hereby corrected as shown below:

<u>Column 18, (continued)</u>
Line 43, please delete the word "mylar" and insert in its place --Mylar--;
Line 47, please delete the word "a";
Line 61, please delete the second occurrence of the word "a" and insert in its place --an--.

Signed and Sealed this

Third Day of July, 2001

*Attest:*

*Attesting Officer*

NICHOLAS P. GODICI
*Acting Director of the United States Patent and Trademark Office*